United States Patent
Zhang et al.

(10) Patent No.: US 11,973,515 B2
(45) Date of Patent: Apr. 30, 2024

(54) HYBRID PRECISION MS DECODER TO REDUCE GATE-COUNT FOR LONG CODES

(71) Applicant: SK hynix Inc., Gyeonggi-do (KR)

(72) Inventors: Fan Zhang, Fremont, CA (US);
Hongwei Duan, San Jose, CA (US);
Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/901,306

(22) Filed: Sep. 1, 2022

(65) Prior Publication Data

US 2024/0080042 A1    Mar. 7, 2024

(51) Int. Cl.
*H03M 13/09* (2006.01)
*H03M 13/00* (2006.01)

(52) U.S. Cl.
CPC ....... *H03M 13/091* (2013.01); *H03M 13/611* (2013.01)

(58) Field of Classification Search
CPC ............ H03M 13/091; H03M 13/611
See application file for complete search history.

(56) References Cited

U.S. PATENT DOCUMENTS

| | | | |
|---|---|---|---|
| 11,204,839 B2 | 12/2021 | Xiong et al. | |
| 2009/0222710 A1* | 9/2009 | Patapoutian | H03M 13/112 714/780 |
| 2014/0281787 A1* | 9/2014 | Wang | H03M 13/13 714/752 |
| 2021/0158169 A1* | 5/2021 | Kim | H03M 13/116 |

* cited by examiner

*Primary Examiner* — Thien Nguyen
(74) *Attorney, Agent, or Firm* — IP & T GROUP LLP

(57) ABSTRACT

A method for operating an MS decoder and an associated memory system utilizing the MS decoder. The method determines an operation mode of the MS decoder. For each variable node, the method calculates a variable to check node V2C message. The method stores, in a check node unit CNU memory, check information associated with the calculated V2C message according to the operation mode. The check information includes full information when the operation mode is a high precision mode, and partial information when the operation mode is a low precision mode.

20 Claims, 8 Drawing Sheets

$$600 \quad H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

HYBRID PRECISION MS DECODER TO REDUCE GATE-COUNT FOR LONG CODES

BACKGROUND

1. Field

Embodiments of the present disclosure relate to a memory system with decoders, and method of operating such system and decoders, particularly to predict decoding failure.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated.

The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

NAND flash-based storage devices have been widely adopted because of their faster read/write performance, lower power consumption, and shock proof features. In general, however, they are more expensive compared to hard disk drives (HDD). To bring costs down, NAND flash manufacturers have been pushing the limits of their fabrication processes towards 20 nm and lower, which often leads to a shorter usable lifespan and a decrease in data reliability. As such, a much more powerful error correction code (ECC) is required over traditional Bose-Chaudhuri-Hocquenghem (BCH) codes to overcome the associated noises and interferences, and thus improve the data integrity. One such code for the ECC is low-density parity-check (LDPC) code. Various algorithms can be utilized for decoding LDPC codes.

There are different iterative decoding algorithms for LDPC codes and associated decoders, such as bit-flipping (BF) decoding algorithms, belief-propagation (BP) decoding algorithms, sum-product (SP) decoding algorithms, min-sum (MS) decoding algorithms, Min-Max decoding algorithms, etc. Some offer speed, while others are more capable at higher noise levels. Multiple decoding algorithms may be used in a particular system to enable different codewords to be decoded using different decoders depending on conditions such as noise level and interference.

In this context, embodiments of the present invention arise.

SUMMARY

Aspects of the present invention include a method for operating an MS decoder. The method determines an operation mode of the MS decoder. For each variable node, the method calculates a variable to check node V2C message. The method stores, in a check node unit CNU memory, check information associated with the calculated V2C message according to the operation mode. The check information includes full information when the operation mode is a high precision mode, and partial information when the operation mode is a low precision mode.

Further aspects of the present invention include a memory system comprising a memory device, a controller in communication with and configured to control the memory device, and a min-sum (MS) decoder in communication with a storage of the memory device. The MS decoder is configured to: for each variable node, calculate a variable to check node V2C message; and store, in a check node unit CNU memory, check information associated with the calculated V2C message according to an operation mode of the MS decoder. The check information includes full information when the operation mode is a high precision mode, and partial information when the operation mode is a low precision mode.

Additional aspects of the present invention include methods, particularly methods of operating memory systems including or associated with decoders. Such a method of operating a memory system comprises inputting.

Other features, aspects and advantages of the present invention will become clear in view of the following description and accompanying the drawings.

DETAILED DESCRIPTION

Figure 1:
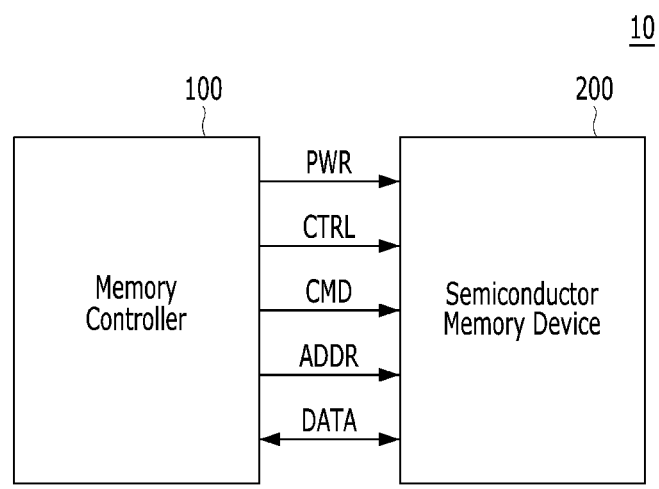
FIG. 1 is a block diagram schematically illustrating a memory system in accordance with an embodiment of the present invention.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrases is not necessarily to the same embodiment(s). Throughout the disclosure, like reference numerals refer to like parts in the figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered is within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims, and the invention encompasses numerous alternatives, modifications and equivalents. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

The present invention recognized that, in comparing to a bit-flip BF decoder, a mini sum MS decoder is strong in error correction, but requires a larger gate-count (GC) than the BF decoder. This means that the throughput per GC, or per power of an MS decoder is lower than a BF decoder. This issue becomes more severe when long codes (e.g., 8 KB or 16 KB) support is needed in the system on chip SoC.

One embodiment of the present invention provides a hybrid precision MS decoder which can support both 4 KB and 8 KB/16 KB at the same time and which is capable of reducing gate-count (GC) of MS decoder for long code support.

As detailed below, in one embodiment, there is provided a method for operating an MS decoder comprising: determining an operation mode of the MS decoder; for each variable node, calculating a variable to check node (V2C) message; and storing, in a check node unit (CNU) memory, check information associated with the calculating the V2C message according to the operation mode. The check information includes full information when the operation mode is a high precision mode, and partial information when the operation mode is a low precision mode. In one embodiment of the present invention, this method permits the high performance of 4 KB, while making the GC of long code relatively small.

FIG. 1 is a block diagram schematically illustrating a memory system in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s).

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
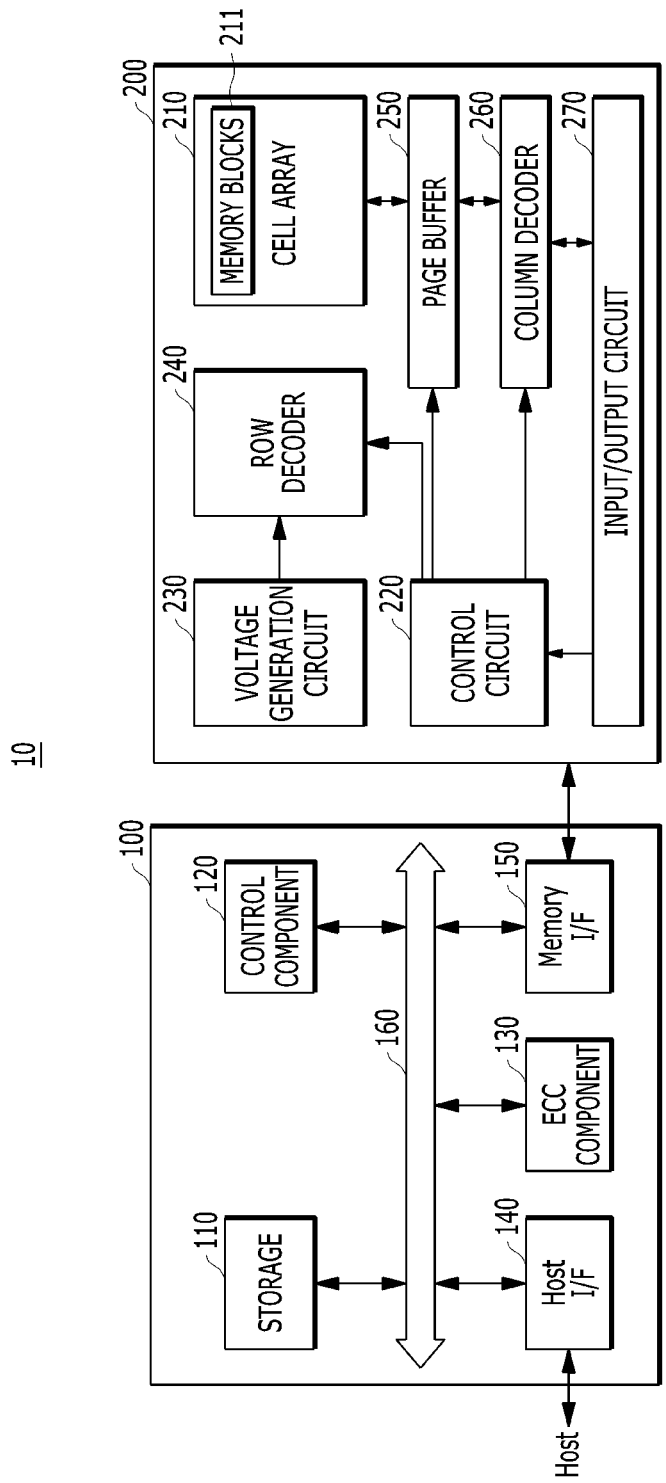
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

The ECC component 130 may perform an error correction operation based on a coded modulation such as a low-density parity-check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
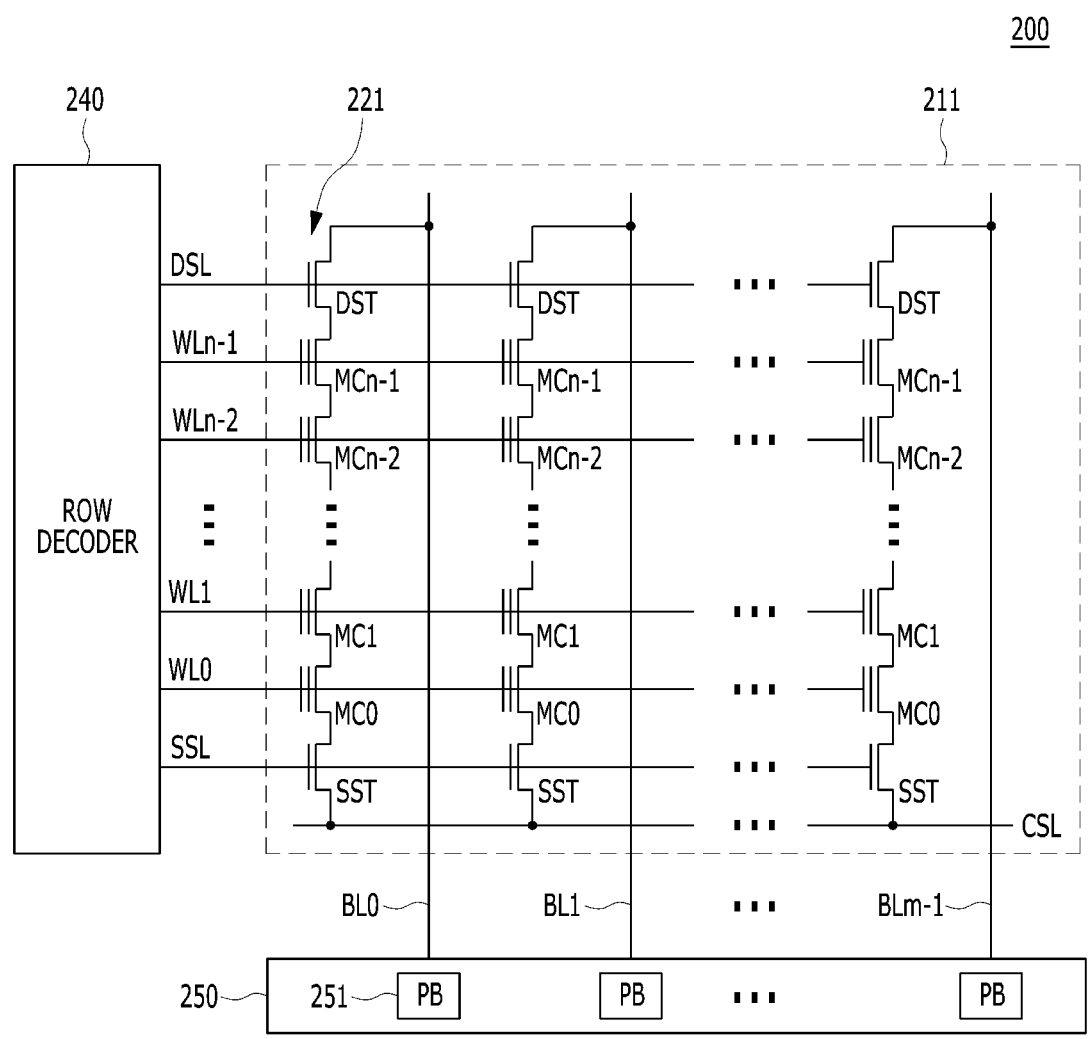
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit/receive data to/from the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multi-level cell (MLC) storing data information of multiple bits.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
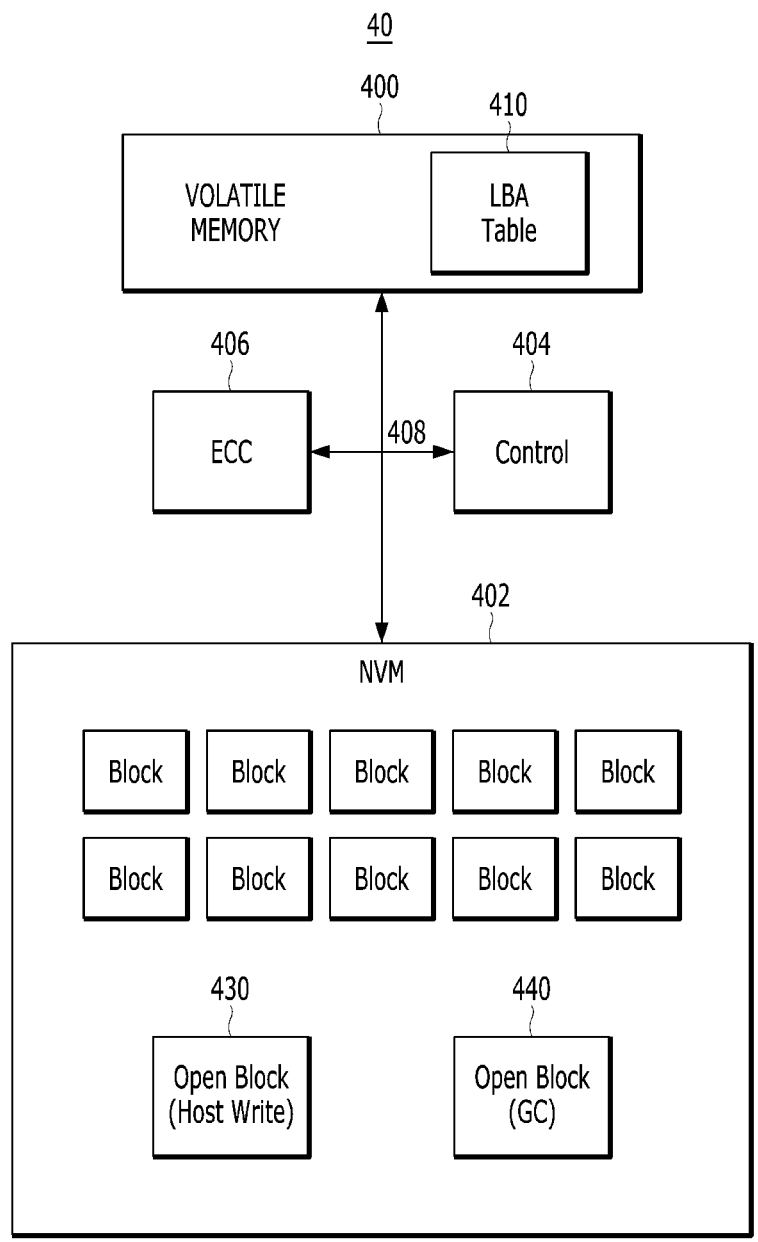
FIG. 4 is a diagram of an exemplary memory system in accordance with an embodiment of the present invention.

Referring to FIG. 4, a general example of a memory system 40 is schematically illustrated. The memory system 40 may include a volatile memory 400 (e.g., a DRAM), a non-volatile memory (NVM) 402 (e.g., NAND), a control component or control logic 404, such as described herein, an error correcting code (ECC) module 406, such as described herein, and a bus 408 through which these components of the memory system 40 communicate. The volatile memory 400 may include a logical bit address LBA table 410 for mapping physical-to-logical addresses of bits. The NVM 402 may include a plurality of memory blocks (and/or a plurality of super memory blocks), as well as an open block for host writes 430 and an open block for garbage collection (GC) 440. The memory system 40 shows a general memory system. Additional/alternative components that may be utilized with memory systems to effectuate the present invention will be understood to those of skill in the art in light of this disclosure.

As referred to herein, terms such as "NAND" or "NVM" may refer to non-volatile memories such as flash memories which may implement error correcting code processes. Further, "DRAM" may refer to volatile memories which may include components such as controllers and ECC modules.

In embodiments of the present invention, the memory system 10 may include multiple decoders that are configured to decode low-density parity-check (LDPC) codes.

There are many iterative decoding algorithms for LDPC codes, such as bit-flipping (BF) decoding algorithms, belief-propagation (BP) decoding algorithms, sum-product (SP) decoding algorithms, min-sum (MS) decoding algorithms, and Min-Max decoding algorithms.

Figures 5, 6:
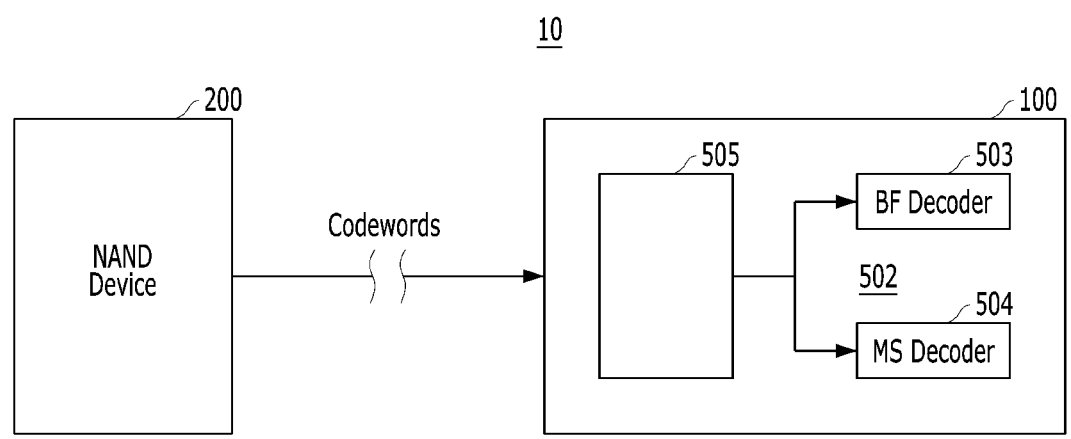
FIG. 5 is a diagram of an exemplary memory system including different decoders in accordance with an embodiment of the present invention.
FIG. 6 is a depiction of a matrix of a LDPC code.

In accordance with embodiments of the present invention, and as shown in FIG. 5, the memory system 10 may include the memory device 200, which may be a NAND device, and the memory controller 100. The memory system 10 may include decoding assembly 502, which includes a bit-flipping (BF) decoder 503 to execute a BF decoding algorithm to decode codewords read from the memory device 501 and a min-sum (MS) decoder 504 to execute an MS decoding algorithm. The BF decoder 503 and the MS decoder 504 may be embodied in the ECC component 130 (shown in FIG. 1) in the memory controller 100 or in any other suitable location. The codewords received from the memory device 200 by the memory controller 100 may be temporarily stored in a buffer or storage 505 of the memory controller 100 before being passed to one or the other of the decoders. In one embodiment of the present invention, the MS decoder 504 is a hybrid precision MS decoder (noted above and described in more detail below).

The memory system 10 may include other components (not shown) such as a checksum module, which computes checksums of codewords retrieved from the memory device 200 before decoding. The checksum module may be embodied within the memory controller 100 before the storage 505. The memory system 10 may further include cyclic redundancy check (CRC) modules disposed downstream of the BF decoder 503 and MS decoder 504, respectively. The CRC modules may be embodied within the memory controller 100.

With respect to the two decoding algorithms, MS decoding, performed by its associated decoder 504, is more powerful due to its higher complexity required to process soft input information. However, the less powerful BF decoding, performed by its associated decoder 503, is useful when the number of errors is low.

MS decoding can be used as part of an iterative LDPC decoding. LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically, the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly, the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figure 7A:
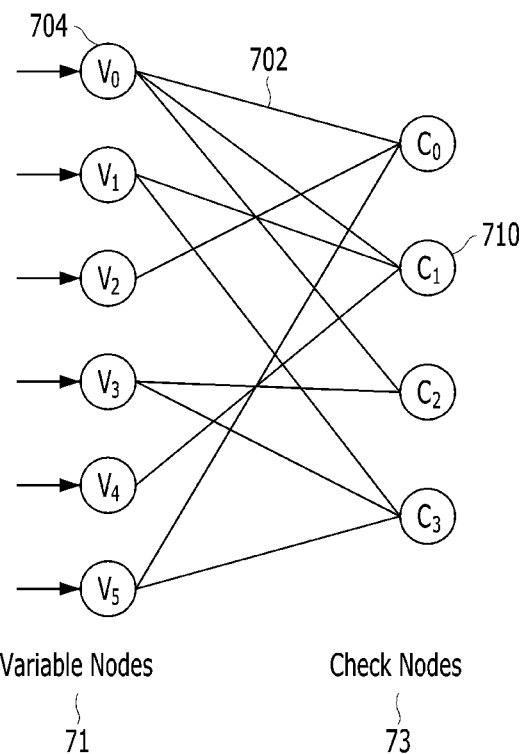
FIGS. 7A and 7B illustrate a Tanner graph representation of the LDPC code and user bits, check nodes and parity bits.

FIG. 6 illustrates an example parity-check matrix H 600, and FIG. 7A illustrates an example bipartite graph corresponding to the parity-check matrix 600.

Figure 7B:
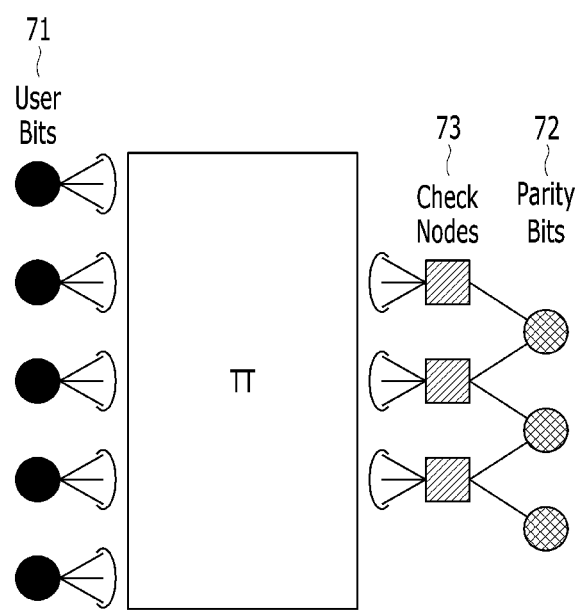

As shown in FIG. 6, the illustrative parity-check matrix 600 has six column vectors and four row vectors. Network 702 shown in FIG. 7A shows the network corresponding to the parity-check matrix 600 and represent a bipartite graph. Various types of bipartite graphs are possible, including, for example, a Tanner graph. A Tanner graph representation of an LDPC code, with user bits 71, parity bits 72 and check nodes 73, is shown in FIG. 7B.

In general, the variable nodes in network 702 correspond to the column vectors in the parity-check matrix 600. The check nodes in network 702 correspond to the row vectors of the parity-check matrix 600. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 600 corresponds to the connection between the variable node 704 and the check node 710.

A message passing algorithm may be used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 7A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword.

At each iteration of the decoding, the systematic (user) bits 71 and the low-degree parity bits 72 (such as shown in FIG. 7B), may be decoded alternatively. The user bits 61 may be decoded one-by-one using for example MS operations. The low-degree parity bits may be jointly decoded using the results of the user bits 71. The results from the joint decoding may be used for the next iteration.

In one embodiment of the present invention, when variable and check nodes are updated iteratively, the LDPC codes are decoded using the hybrid precision MS decoder described below.

Figure 8:
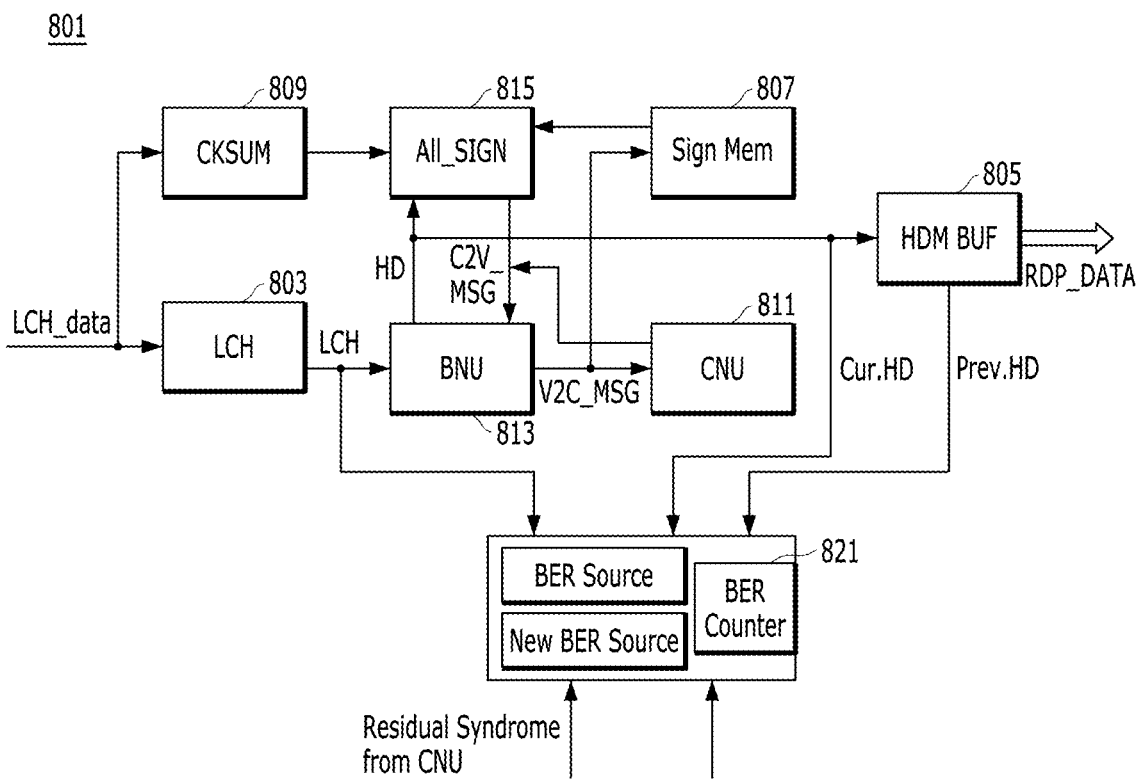
FIG. 8 is a block diagram of a hybrid precision MS decoder in accordance with one embodiment of the present invention.

FIG. 8 is a block diagram of a hybrid precision MS decoder in accordance with one embodiment of the present invention. As shown in FIG. 8, MS decoder 801 contains LCH memory 803, HD memory buffer 805, V2C_sign memory 807, checksum memory 809, CNU memory array 811, a bit node update unit BNU 813, and an ALL SIGN unit 815. Output from the decoder is supplied (in one embodiment of the present invention) to an error correction unit 821 (such as a bit error rate counter).

LCH memory 803 stores or otherwise holds a channel value (that is user or data bits 71). HD memory buffer 805 stores or otherwise holds the up-to-date best estimate of a decoding outcome. V2C_sign memory 807 stores or otherwise holds the sign of each V2C message. Checksum memory 809 stores or otherwise holds the syndrome value(s). CNU memory array 811 stores or otherwise holds the min1, mint and min1 index and mint index values for each checksum. Min1 is an absolute value of a minimum magnitude and Min1_idx is a value indicating the location of the magnitude Min1. Correspondingly, Min2 is an absolute value of a second to minimum magnitude and Min2_idx is a value indicate the location of the magnitude Min2. This is often implemented as flip-flops, and a per cycle access/update is needed.

During for example a MS LDPC decoding, when stored data is requested or otherwise desired (e.g., by an application or user which stored the data), the data read may include noise or errors, and can be stored in LCH memory 803. A likelihood ratio (LLR) value generator for example in the BNU unit 813 may access the read data, may process the read data, and may output LLR values for each bit read. Based on the LLR values and based on variable to check node messages V2C_MSG (shown in FIG. 8) decoding can be performed on the read data. If decoding is successful, then a decoded codeword may be output.

As noted above. the MS decoder 801 may include a check node update (CNU) unit 811, a bit node update (BNU) unit 813, and a check sum update (CSU) unit 809. The CNU 811 may be configured to receive from the BNU 813 bit to check messages (Lbc) (e.g., for a 3-bit decoder, 1 bit may be assigned to the sign and two bits may be assigned to the magnitude), as well as location references (idx). CNU 811 may also may also have access to all_sgn values corresponding to the product of the sign of Lbc messages (and stored in All-Sign unit 815). The CNU 811 may also be configured to output check to bit messages (Lcb) based on a location reference idx and sgn_mem contents. sgn_mem values are stored in Sign Mem unit 807 and contain/include the sign of the bit to check message (Lbc).

During decoding, as noted above, several iterations may occur. Values from previous decoding iterations may be used. For example, a previous decoding may have found that the magnitude of the Lcb is Min1/Min2 based on min1_idx and the input location reference idx. The sign of the Lcb is all_sgn*sgn—mem.

BNU 813 may use scaling factors and compute Lbc values. In addition, the BNU 813 may be configured to update hard decisions (hard_dec) (e.g., a decision made as to whether a bit is a 0 or 1), which may then be used by the CKSUM 809 to check if the data has converged to a codeword, in which case decoding can be stopped.

CKSUM 808 may receive the hard decisions HD from the BNU 813 and may be configured to calculate the checksum (e.g., the XOR parity of hard decisions) for each parity check. If all the parity checks are zero, the codeword has converged. CKSUM 808 may also be configured to output the calculated/computed checksum.

In more detail, the following procedures can be used in a MS decoder:

Initialization: LCH memory is initialized to the channel values. CNU memory is initialized to [max, max, 0, 1] for each checksum. Set iteration count to 0.

For each iteration:
If iteration reaches max, terminate decoding.
For each variable node VN in each circulant column: generate a variable to check node V2C message.
For each check node CN connected to the VN, calculate a check-to variable node C2V message.
Calculate total LLR and update HD memory 805.
Update checksum memory 809.
Calculate another V2C message and update the CNU memory array 811 based on the most recent V2C message.
If checksum is all zero or a cyclic redundancy check CRC of codeword passes with condition, terminate decoding.

For a conventional MS decoder, min1. value (4-bit), min1 index (6-bit), mint value (4-bit), mint index (6-bit), and checksum (1-bit) values are stored in CNU memory array 811. The CNU memory array 811 has been typically implemented by registers and comprises a large percentage of the gate count GC of a MS decoder. The channel information LCH unit 803 has also been set with 4 bit precision.

It is noteworthy that other kinds of GC optimized MS decoders have been used with lower precision (3 bit or 2 bit) for the min1, mint values and also used lower precision values in the LCH memory. The LCH memory has also been set to 3 bit or 2 bit precision in the past.

It is noteworthy that other types of simplified MS decoders have been used which only stored min1, min2 and min1 index and checksum in each CNU. Combined with lower precision, these simplified designs had a reduced GC for the MS decoder.

In the present invention, a hybrid precision MS decoder is provided which uses high precision (and stores full check node CN information when 4 KB mode is in use) and which uses low precision (and stores partial CN information when 8 KB/16 KB mode is in use). This hybrid precision MS decoder supports on-the-fly code-length change by changing the usage modes. The gate count GC of this hybrid decoder is determined primarily by the long code (8 KB or 16 KB mode) which uses low precision and hence reduces GC comparing to a completely high precision MS decoder.

Returning now to the block diagram of the hybrid decoder shown in FIG. 8, LCH memory 803 consumes about 20% of the GC of MS decoder, and CNU memory 811 consumes about 40% of GC of the MS decoder 801. In one embodiment of the present invention, these two blocks work in a high precision mode (4 bit per information bit) if a 4 KB mode is set to the decoder. These two blocks work in a low precision is mode (2 bit or 3 bit) if 8 KB or 16 KB mode is set to the decoder.

Assume that the code length is n, and a 2 bit partial CNU MS decoder is used for a low precision mode. Further, assume both 4 KB and 16 KB MS decoder process t bits per cycle. The LCH memory size is set to k*4 wide and n/k deep. The 4 KB decoder will read data from the LCH memory 803 for t/k consecutive addresses in every cycle. The 16 KB decoder will read data from LCH memory 803 for t/(2k) consecutive address in every cycle. The CNU memory 811 for 4 KB precision will access d*(4+4+6+6+1)*128 registers from the CNU register array 811 and a 16 KB decoder will access d*(2+2+6+1)*128 registers from the CNU register array 811, where d is the column weight of the current column under processing.

In the example above, the LCH memory size is reduced by half and the CNU register size is reduced by about half as compared to a non-hybrid 16 KB MS decoder. GC and power savings follow from the inventive hybrid MS decoder. Any tradeoff in correction capability is offset by the savings in GC and power consumption.

Figure 9:
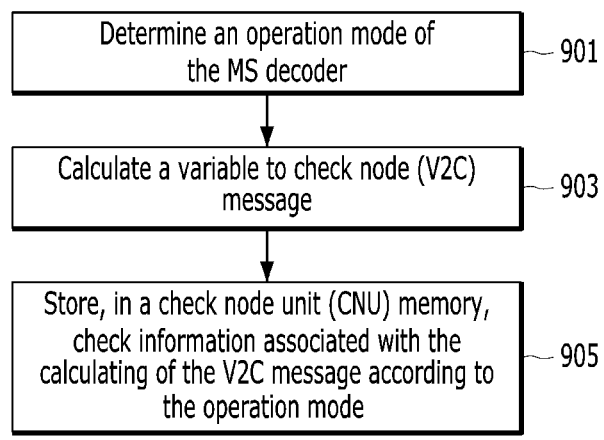
FIG. 9 is a flowchart depicting a method for operating an MS decoder in accordance with one embodiment of the present invention.

FIG. 9 is a flowchart depicting a method for operating an MS decoder in accordance with one embodiment of the present invention. As illustrated in FIG. 9, at 901, the method determines an operation mode of the MS decoder. As used herein, the operation mode of the MS decoder refers to the number of registers (or register size) operating used in the MS decoder. At 903, for each variable node, the method calculates a variable to check node (V2C) message. At 905, the method stores, in a check node unit (CNU) memory, check information associated with the calculating of the V2C message according to the operation mode. The check information includes full information when the operation mode is a high precision mode, and includes partial information when the operation mode is a low precision mode. An example a full information and partial information is given below. In general, the partial information is a subset of the full information meaning that the partial information contains less information related to the metrics for error code processing including but not limited to information stored at a lower bit precision.

In one aspect of this method, the full information may include, for each checksum, a min1 value, a min1 index, a mint value, a mint index, and a checksum. In this aspect, the min1 value and the mint value are stored in the check node unit CNU memory at a 4 bit precision, the min1 index and the mint index are stored in the check node unit CNU memory at a 6 bit precision, and the checksum is stored at a 1 bit precision. The operation mode may operate in a 4 KB mode with the full information.

In one aspect of this method, the partial information may include, for each checksum, a min1 value, a min1 index, a mint value, and a checksum. In this aspect, the min1 value and the mint value are stored in the check node unit CNU memory at a 2 or 3 bit precision, the min1 index is stored in the check node unit CNU memory at a 6 bit precision, and the checksum is stored at a 1 bit precision. For the partial information, the operation mode operates in a 8 KB or a 16 KB mode. In one aspect of this method, the CNU memory in the MS decoder operates as part of a MS LDPC decoder, and iterations of MS LDPC decoding continue until a maximum number of iterations is reached or until a LDPC codeword is successfully decoded.

In one aspect of this method, the MS decoder has a reduced gate count compared to a decoder operating entirely in the high precision mode.

In the present invention, there is provided a memory system comprising a memory device, a controller in communication with and configured to control the memory device, and a min-sum (MS) decoder in communication with a storage of the memory device. The MS decoder is configured to: for each variable node, calculate a variable to check node V2C message; and store, in a check node unit CNU memory, check information associated with the calculated V2C message according to an operation mode of the MS decoder. The check information includes full information when the operation mode is a high precision mode, and partial information when the operation mode is a low precision mode.

In one aspect of this system, the full information may include, for each checksum, a min1 value, a min1 index, a mint value, a mint index, and a checksum. In this aspect, the min1 value and the mint value are stored in the check node unit CNU memory at a 4 bit precision, the min1 index and the mint index are stored in the check node unit CNU memory at a 6 bit precision, and the checksum is stored at a 1 bit precision. The operation mode may operate in a 4 KB mode with the full information.

In one aspect of this system, the partial information may include, for each checksum, a min1 value, a min1 index, a mint value, and a checksum. In this aspect, the min1 value and the mint value are stored in the check node unit CNU memory at a 2 or 3 bit precision, the min1 index is stored in the check node unit CNU memory at a 6 bit precision, and the checksum is stored at a 1 bit precision. For the partial information, the operation mode operates in a 8 KB or a 16 KB mode. In one aspect of this method, the CNU memory in the MS decoder operates as part of a MS LDPC decoder, and iterations of MS LDPC decoding continue until a maximum number of iterations is reached or until a LDPC codeword is successfully decoded.

In one aspect of this system, the MS decoder has a reduced gate count compared to a decoder operating entirely in the high precision mode.

Although the foregoing embodiments have been described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive.

What is claimed is:

1. A method for operating an MS decoder comprising:
   determining an operation mode of the MS decoder based on code lengths of codewords being decoded, the MS decoder having a channel value memory storing data bits;
   for each variable node, calculating a variable to check node V2C message including check information; and
   storing, in a check node unit CNU memory, the check information associated with the calculated V2C message according to the operation mode,
   wherein the check information includes full information when the operation mode is a high bit precision mode for a first codeword length, and includes partial information when the operation mode is a low bit precision mode for a second codeword length longer than the first codeword length, and
   wherein the MS decoder supports on-the-fly code-length changes by changing the operational mode.

2. The method of claim 1, wherein the full information includes, for each checksum, a min1 value, a min1 index, a min2 value, a min2 index, and a checksum.

3. The method of claim 2, wherein
   the min1 value and the min2 value are stored in the check node unit CNU memory at a 4 bit precision,
   the min1 index and the min2 index are stored in the check node unit CNU memory at a 6 bit precision, and
   the checksum is stored at a 1 bit precision.

4. The method of claim 2, wherein, for the full information, the operation mode operates in a 4 KB mode.

5. The method of claim 1, wherein the partial information includes, for each checksum, a min1 value, a min1 index, a min2 value, and a checksum.

6. The method of claim 5, wherein
   the min1 value and the min2 value are stored in the check node unit CNU memory at a 2 or 3 bit precision,
   the min1 index is stored in the check node unit CNU memory at a 6 bit precision, and
   the checksum is stored at a 1 bit precision.

7. The method of claim 5, wherein, for the partial information, the operation mode operates in a 8 KB or a 16 KB mode.

8. The method of claim 1, wherein the CNU memory in the MS decoder operates as part of a MS LDPC decoder.

9. The method of claim 8, wherein iterations of MS LDPC decoding continue until a maximum number of iterations is reached or until a LDPC codeword is successfully decoded.

10. The method of claim 9,
    wherein the channel value memory and the CNU memory work in the high bit precision mode when the codewords have the first codeword length,
    wherein the channel value memory and the CNU memory work in the low bit precision mode when the codewords have the second codeword length longer than the first codeword length, and
    wherein the MS decoder in the low bit precision mode has a reduced gate count compared to the MS decoder operating entirely in the high bit precision mode.

11. A memory system comprising:
    a memory device;
    a controller in communication with and configured to control the memory device; and
    a min-sum (MS) decoder in communication with a storage of the memory device, the MS decoder having a channel value memory storing data bits, wherein the MS decoder is configured to:
determine an operation mode of the MS decoder based on code lengths of codewords being decoded for each variable node, calculate a variable to check node V2C message including check information; and
store, in a check node unit CNU memory, the check information associated with the calculated V2C message according to an operation mode of the MS decoder,
wherein the check information includes full information when the operation mode is a high bit precision mode for a first codeword length, and includes partial information when the operation mode is a low bit precision mode for a second codeword length longer than the first codeword length, and
wherein the MS decoder supports on-the-fly code-length changes by changing the operational mode.

12. The system of claim 11, wherein the full information includes, for each checksum, a min1 value, a min1 index, a min2 value, a min2 index, and a checksum.

13. The system of claim 12, wherein
the min1 value and the min2 value are stored in the check node unit CNU memory at a 4 bit precision,
the min1 index and the min2 index are stored in the check node unit CNU memory at a 6 bit precision, and
the checksum is stored at a 1 bit precision.

14. The system of claim 12, wherein, for the full information, the operation mode operates in a 4 KB mode.

15. The system of claim 11, wherein the partial information includes, for each checksum, a min1 value, a min1 index, a min2 value, and a checksum.

16. The system of claim 15, wherein
the min1 value and the min2 value are stored in the check node unit CNU memory at a 2 or 3 bit precision,
the min1 index is stored in the check node unit CNU memory at a 6 bit precision, and
the checksum is stored at a 1 bit precision.

17. The system of claim 15, wherein, for the partial information, the operation mode operates in a 8 KB or a 16 KB mode.

18. The system of claim 11, wherein the CNU memory in the MS decoder operates as part of a MS LDPC decoder.

19. The system of claim 18, wherein iterations of MS LDPC decoding continue until a maximum number of iterations is reached or until a LDPC codeword is successfully decoded.

20. The system of claim 19,
wherein the channel value memory and the CNU memory work in the high bit precision mode when the codewords have the first codeword length,
wherein the channel value memory and the CNU memory work in the low bit precision mode when the codewords have the second codeword length longer than the first codeword length, and
wherein the MS decoder in the low bit precision mode has a reduced gate count compared to the MS decoder operating entirely in the high bit precision mode.

* * * * *